(12) United States Patent
Cozzan et al.

(10) Patent No.: US 11,742,452 B2
(45) Date of Patent: Aug. 29, 2023

(54) INVERTED METAMORPHIC MULTIJUNCTION SOLAR CELL

(71) Applicant: SolAero Technologies Corp., Albuquerque, NM (US)

(72) Inventors: Clayton Cozzan, Albuquerque, NM (US); John Hart, Albuquerque, NM (US); Michael W. Riley, Los Lunas, NM (US); Christopher Kerestes, Albuquerque, NM (US)

(*) Notice: Subject to any disclaimer, the term of this patent is extended or adjusted under 35 U.S.C. 154(b) by 0 days.

(21) Appl. No.: 17/717,621

(22) Filed: Apr. 11, 2022

(65) Prior Publication Data

US 2022/0254948 A1 Aug. 11, 2022

Related U.S. Application Data

(62) Division of application No. 17/161,351, filed on Jan. 28, 2021.

(51) Int. Cl.
*H01L 31/054* (2014.01)
*H01L 31/0687* (2012.01)
*H01L 31/0725* (2012.01)
*H01L 31/0735* (2012.01)
*H01L 31/18* (2006.01)

(52) U.S. Cl.
CPC ...... *H01L 31/1844* (2013.01); *H01L 31/0543* (2014.12); *H01L 31/0547* (2014.12); *H01L 31/0687* (2013.01); *H01L 31/0725* (2013.01); *H01L 31/0735* (2013.01); *H01L 31/1892* (2013.01)

(58) Field of Classification Search
CPC ............ H01L 31/0543; H01L 31/0547; H01L 31/0687; H01L 31/06875; H01L 31/0725; H01L 31/0735; H01L 31/18; H01L 31/1844; H01L 31/1892
See application file for complete search history.

(56) References Cited

U.S. PATENT DOCUMENTS

| 6,150,603 | A  |   | 11/2000 | Karam |
| 9,018,521 | B1 | * | 4/2015 | Cornfeld ................. H01L 33/10 |
|           |    |   |        | 136/262 |
| 9,758,261 | B1 | * | 9/2017 | Steinfeldt ............. H01L 31/078 |
| 9,768,329 | B1 |   | 9/2017 | Kayes et al. |

(Continued)

FOREIGN PATENT DOCUMENTS

DE 102011008269 7/2012
EP 0908933 4/1999

(Continued)

OTHER PUBLICATIONS

Machine translation of JP-2014049670-A, Sano Y. (Year: 2014).*

(Continued)

*Primary Examiner* — Mayla Gonzalez Ramos

(57) ABSTRACT

A solar cell comprising an epitaxial sequence of layers of semiconductor material thrilling at least a first and second solar subcells; a semiconductor contact layer disposed on the bottom surface of the second solar subcell; a reflective metal layer disposed below the semiconductor contact layer such that the reflectivity of the reflective metal layer is greater than 80% in the wavelength range 850 to 2000 nm, for reflecting light back into the second solar subcell.

20 Claims, 7 Drawing Sheets

(56) References Cited

U.S. PATENT DOCUMENTS

| | | | |
|---|---|---|---|
| 10,211,361 | B1 | 2/2019 | Riley et al. |
| 2005/0048739 | A1 | 3/2005 | Kerdiles |
| 2010/0282305 | A1 | 11/2010 | Sharps et al. |
| 2011/0041898 | A1 | 2/2011 | Cornfeld |
| 2015/0357501 | A1* | 12/2015 | Derkacs ............... H01L 31/078 438/66 |
| 2016/0181464 | A1 | 6/2016 | Cornfeld |
| 2017/0148930 | A1 | 5/2017 | Zhu |

FOREIGN PATENT DOCUMENTS

| | | | |
|---|---|---|---|
| EP | 0908933 A1 * | 4/1999 | |
| EP | 3872868 | 9/2021 | |
| JP | 2014049670 | 3/2014 | |
| JP | 2014049670 A * | 3/2014 | |
| KR | 1134730 | 4/2012 | |

OTHER PUBLICATIONS

Aho Time: "Advanced 111-V Solar Cells with back Reflectors" Dissertation, Nov. 27, 2020, pp. 1-92, XP055889238.

Cevicchi BT et al. : "GAAS on GE Cell and Panel Technology for Advanced Space Flight Application", Photovoltaic Specialists Conference, Las Vegas, Sep. 26-30, 1988; [Photovltaic Specialists Conference], New York, IEEE.US vol. 2,Sep. 26, 1988 pp. 918-923, XP000167184.

Chen Hung-Ling et al.: "A 19.9%-efficient ultrathin solar cell based on a 205-nm-thick GaAs absorber and a silver nanostructured back mirror", Nature Energy, Nature Publishing Group UK, London, vol. 4, No. 9, Aug. 5, 2019 {Aug. 5, 2019), pp. 761-767, XP036885065M DOI: 10.1038/S41560-019-0434-Y [retrieved on Aug. 5, 2019].

Claiborne O McPheeters et al: "Performance benefits for thin film solar cells incorporating semiconductor heterostructures and light trapping", Photovoltaic Specialists Conference {PVSC), 2012 38TH IEEE, Jun. 3, 2012 {Jun. 3, 2012), pp. 1566-1571, XP032258111, DOI:10.1109/PVSC.2012.6317893 ISBN:978-1-4673-0064-3.

European Search Report and Opinion dated Jun. 30, 2020 for European Patent Application No. 20159311.8, 9 pages.

European Search Report dated Mar. 6, 2022 for European Patent Application No. 22152580.1-1002, 14 pages.

John F Geisz et al.: "GMS on GE Cell and Panel Technology for Advanced Space Flight Application", 2010 25th IEEE Photovoltaic Specialists Conference, Jun. 2010, pp. 002021-002025, XP055015302, DOI: 10.1109/PVSC.20m5616973 ISBN: 798-1-42-445890~5.

Machine translation of DE 102011008269 A 1, KAPP ERTZ 0. (Year: 2012).

Machine translation of KR-1134730-B1, Bae D. (Year: 2012).

Tatavarti, R. et al., "Lightweight, low cost InGaP/GaAs dual-junction solar cells on 100 mm epitaxial liftoff {ELO) wafers", 34th IEEE Photovoltaic Specialists Conference {PVSC), p. 002065-002067 (Year: 2009).

Zhu Lin et al.: "Design of InGaP/GaAs/InGaAs multi-juntion cells with reduced layer thicknesses using light-trapping 4 rear texture", 2017 IEEE 44TH Photovoltaic Specialist Conference {PVSC), IEEE, Jun. 25, 2017 {Jun. 25, 2017), pp. 3528-3533, XP033452431, DOI: 10.1109/PVSC.2017.8366274 [retrieved on May 25, 2018].

Zol Tan Sarosi et al.: "Evaluation of Reflectivity of Meta Parts by a Thermo-Camera" IMFRAMATION 2010 Proceedings, Nov. 8-12, 2010-Bally's, Las Vegas, Nevada. Nov. 8, 2010, pp. 1-10 XP002690450.

* cited by examiner

INVERTED METAMORPHIC MULTIJUNCTION SOLAR CELL

REFERENCE TO RELATED APPLICATIONS

This application is a divisional of U.S. patent application Ser. No. 17/161,351, filed Jan. 28, 2021.

The present application is also related to U.S. patent application Ser. No. 12/544,001 filed Aug. 19, 2009, herein incorporated by reference.

GOVERNMENT RIGHTS STATEMENT

This invention was made with government support under Contract No. FA 9453 19-C-1001 awarded by the U.S. Air Force. The Government has certain rights in the invention.

BACKGROUND

Field of the Disclosure

The present disclosure relates to the field of semiconductor devices, and to fabrication processes and devices such as multijunction solar cells based on III-V semiconductor compounds including a metamorphic layer. Such devices in some embodiments are also known as inverted metamorphic multijunction solar cells.

Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor-multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500×), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

Typical III-V compound semiconductor solar cells are fabricated on a semiconductor wafer in vertical, multijunction structures. The individual solar cells or wafers are then disposed in horizontal arrays, with the individual solar cells connected together in an electrical series circuit. The shape and structure of an array, as well as the number of cells it contains, are determined in part by the desired output voltage and current.

Inverted metamorphic multijunction (IMM) solar cell structures based on III-V compound semiconductor layers, such as described in M. W. Wanlass et al., Lattice Mismatched Approaches for High Performance, III-V Photovoltaic Energy Converters (Conference Proceedings of the 31$^{st}$ IEEE Photovoltaic Specialists Conference, Jan. 3-7, 2005, IEEE Press, 2005), present an important conceptual starting point for the development of future commercial high efficiency solar cells. However, the materials and structures for a number of different layers of the cell proposed and described in such reference present a number of practical difficulties relating to the appropriate choice of materials and fabrication steps.

Improving the efficiency of space-grade solar cells has been the goal of researchers for decades. Efficiency of space-grade solar cells has improved from 23% (for a dual junction InGaP/GaAs on inactive Ge) to 29.5% (for a triple-junction InGaP/InGaAs/Ge solar cell), which not only been realized through improved material quality, hut also through improved cell designs that reduce power degradation from charged particle radiation and higher temperatures that is characteristic of the space operating environment.

The composition of the back metal layer in such inverted metamorphic multijunction solar cells is one such consideration that has not received much attention. Although the related application noted above discusses a variety of different metal compositions, some suggested metals diffuse into the active layers of the adjacent subcell, thereby impairing its efficiency and efficacy. Moreover, scant attention has been paid to the goal of increasing the optical path length in the solar cell through back reflection, and reducing the temperature of the solar-cell through rejecting long wavelength (IR) radiation. The present disclosure seeks to address such issues.

SUMMARY

Briefly, and in general terms, the present disclosure provides a method of manufacturing a solar cell comprising: providing a growth substrate; depositing on the growth substrate an epitaxial sequence of layers of semiconductor material forming at least a first and second solar subcells; depositing a semiconductor contact layer on top of the second solar subcell; depositing a reflective metal layer composed of any one or more of the following metals or alloys thereof: Al, Be, and Ni to a thickness between 50 nm and 5 microns over said semiconductor contact layer such that the reflectivity of the reflective metal layer is greater than 80% in the wavelength range 850-2000 nm; depositing a contact metal layer composed of one or lore layers of Ag, Au and Ti on said reflective metal layer; mounting and bonding a surrogate substrate on top of the contact metal layer; and removing the first substrate.

In some embodiments, the reflective metal layer comprises one or more of the following metals or alloys thereof: Ag, Al, Au, Be, Cu, Mo, Ni or Ti, and further comprising depositing a diffusion barrier layer directly on said semiconductor contact layer, wherein the reflective metal layer is deposited directly on the diffusion barrier layer.

In some embodiments, the thickness of the reflective metal layer is in the range of 50 nm to 200 nm.

In some embodiments, the composition of the reflective metal layer is composed solely of Ag.

In some embodiments, the composition of the reflective metal layer is composed solely of Al.

In some embodiments, the composition of the reflective metal layer is composed solely of Au.

In some embodiments, the composition of the reflective metal layer is composed solely of Be.

In some embodiments, the composition of the reflective metal layer is composed solely of Cu.

In some embodiments, the composition of the reflective metal layer is composed solely of Mo.

In some embodiments, the composition of the reflective metal layer is composed solely of Ni.

In some embodiments, the composition of the reflective metal layer is composed solely of Ti.

In some embodiments, the thickness of the reflective metal layer is between 50 nm and 5 microns.

In some embodiments, these further comprise the step of depositing a diffusion barrier layer directly on said semiconductor contact layer, wherein the reflective metal layer is deposited directly on the diffusion barrier layer.

In some embodiments, the diffusion barrier layer is composed of one or more layers of Cr, Pd, Pt, Si, Ti or TiN.

In some embodiments, the diffusion barrier layer has a thickness of between 0.1 nm and 10.0 nm.

In some embodiments, in the case of Si in the diffusion barrier layer, the silicon may be either polycrystalline or amorphous.

In some embodiments, the diffusion barrier layer has a thickness between 1.0 and 3.0 nm.

In another aspect the present disclosure provides a method of manufacturing a solar cell comprising: providing a growth substrate depositing on the growth substrate an epitaxial sequence of layers of a III-V compound semiconductor material forming at least a first top or light-facing solar subcell and a second bottom solar subcell, the second bottom solar subcell has a top surface and a bottom surface depositing a diffusion barrier layer directly on the bottom surface of the bottom solar subcell depositing a reflective metal layer directly on the diffusion barrier layer to a thickness between 50 nm and 5 microns over said semiconductor contact layer such that the reflectivity of the reflective metal layer is greater than 80% in the wavelength range 850-2000 nm and depositing a contact metal layer composed of one or more layers of Ag, Au, and Ti on said reflective metal layer.

In some embodiments, the diffusion barrier layer is composed of one or more of the following or alloys thereof: Cr, Pd, Pt, Si, Ti, or TiN deposited to an aggregate thickness between 0.1 and 10.0 nm.

In another aspect, the present disclosure provides a solar cell comprising: an epitaxial sequence of layers of III-V compound semiconductor material forming at least a top light-facing solar subcell and a bottom solar subcells, the bottom solar subcell having a top surface and a bottom surface a reflective metal layer composed of one or more of the following metals or alloys thereof: Al, Be, and Ni such that the reflectivity of the reflective metal layer is greater than 80% reflectivity in the wavelength range 850-2000 nm and having a thickness between 50 nm and 5 microns deposited on the bottom surface of layer of the bottom solar subcell a contact metal layer composed of one or more layers of Ag, Au, and Ti, having a top surface mounted to the reflective metal layer, and a bottom surface and a supporting substrate bonded to the bottom surface of the contact metal layer.

In another aspect, the present disclosure provides a method of manufacturing a solar cell by: providing a first substrate; depositing on the first substrate a first sequence of layers of semiconductor material forming a first solar subcell, a second solar subcell, and a third solar subcell; depositing on said third solar subcell a grading interlayer; depositing on said grading interlayer a second sequence of layers of semiconductor material forming a fourth solar subcell, the fourth solar subcell being lattice mismatched to the third solar subcell; depositing a reflective metal layer on the fourth solar subcell; and removing the first substrate.

In one or more embodiments, the first graded interlayer may be compositionally graded to lattice match the third solar subcell on one side and the fourth solar subcell on the other side.

In one or more embodiments, the first graded interlayer may be composed of any of the As, P, N, Sb based III-V compound semiconductors subject to the constraints of having the in-plane lattice parameter greater than or equal to that of the third solar subcell and less than or equal to that of the fourth solar subcell, and may have a band gap energy greater than that of the third solar subcell and of the fourth solar subcell.

In one or more embodiments, the first graded interlayer may be composed of $(In_xGa_{1-x})Al_{1-y}As$ with $0<x<1$, $0<y<1$, and x and y selected such that the band gap remains constant throughout its thickness.

In one or more embodiments, the band gap of the first graded interlayer may remain at a constant value in the range of 1.42 to 1.60 eV throughout its thickness.

In one or more embodiments, the upper first subcell may be composed of an AlInGaP or InGaP emitter layer and an AlInGaP base layer, the second subcell may be composed of InGaP emitter layer and an AlGaAs base layer, the third subcell may be composed of an InGaP or GaAs emitter layer and an GaAs base layer, and the bottom fourth subcell may be composed of an InGaAs base layer and an InGaAs emitter layer lattice matched to the base.

In one or more embodiments, the fourth solar subcell may have a band gap in the range of approximately 1.05 to 1.15 eV, the third solar subcell may have a band gap in the range of approximately 1.40 to 1.42 eV, the second solar subcell may have a band gap in the range of approximately 1.65 to 1.78 eV and the first solar subcell may have a band gap in the range of 1.92 to 2.2 eV.

In one or more embodiments, the fourth solar subcell may have a band gap of approximately 1.10 eV, the third solar subcell may have a band gap in the range of 1.40-1.42 eV, the second solar subcell may have a band gap of approximately 1.73 eV and the first solar subcell may have a band gap of approximately 2.10 eV.

In one or more embodiments, the first solar subcell may be composed of AlGaInP, the second solar subcell may be composed of an InGaP emitter layer d a AlGaAs base layer, the third solar subcell may be composed of GaAs or $In_xGaAs$ (with the value of x in $In_x$ between 0 and 1%), and the fourth solar subcell may be composed of InGaAs.

In one or more embodiments, each of the second subcell and the upper first subcell comprise aluminum in addition to other semiconductor elements.

In one or more embodiments, each of the second subcell and the upper first subcell comprise aluminum in such quantity so that the average band gap of the top four subcells (i.e. the sum of the band gaps of each subcell, divided by four) is greater than 1.44 eV.

In one or more embodiments, the selection of the composition of the subcells and their band gaps maximizes the efficiency of the solar cell at a predetermined high temperature value (in the range of 40 to 70 degrees Centigrade) in deployment in space at AM0 at a predetermined time after the beginning of life (BOL), such predetermined time being referred to as the end-of-life (EOL) time.

In one or more embodiments, the selection of the composition of the subcells and their band gaps maximizes the efficiency of the solar cell at a predetermined high temperature value (in the range of 40 to 70 degrees Centigrade) not at initial deployment, but after continuous deployment of the solar cell in space at AM0 at a predetermined time after the initial deployment, such time being at least one year, with the average band gap of the top four subcells being greater than 1.44 eV.

In one or more embodiments, the predetermined time after the initial deployment is at least two years.

In some embodiments, the predetermined time is at least two years.

In some embodiments, the predetermined time is at least five years.

In some embodiments, the predetermined time is at least ten years.

In some embodiments, the predetermined time is at least twelve years.

In some embodiments, the predetermined time is at least fifteen years.

In one or more embodiments, the selection of the composition of the subcells and their band gaps maximizes the efficiency of the solar cell at a predetermined high temperature value (in the range of 40 to 70 degrees Centigrade) not at initial deployment, but after continuous deployment of the solar cell in space at AM0 at a predetermined time after the initial deployment, such time being at least x years, where x is in the range of 1 to 20, with the average band gap of the top four stibcells being greater than 1.44 eV, or in some embodiments greater than 1.35 eV.

In some embodiments, additional layer(s) may be added or deleted in the cell structure without departing from the scope of the present disclosure.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teaching herein will recognize additional applications, modifications and embodiments in other fields, which are within the scope of the disclosure as disclosed and claimed herein and with respect to which the disclosure could be of utility.

BRIEF DESCRIPTION OF THE DRAWING

The apparatus and methods described herein will be better and more fully appreciated by reference to the following detailed description when considered in conjunction with the accompanying drawings, wherein.

GLOSSARY OF TERMS

Figure 1A:
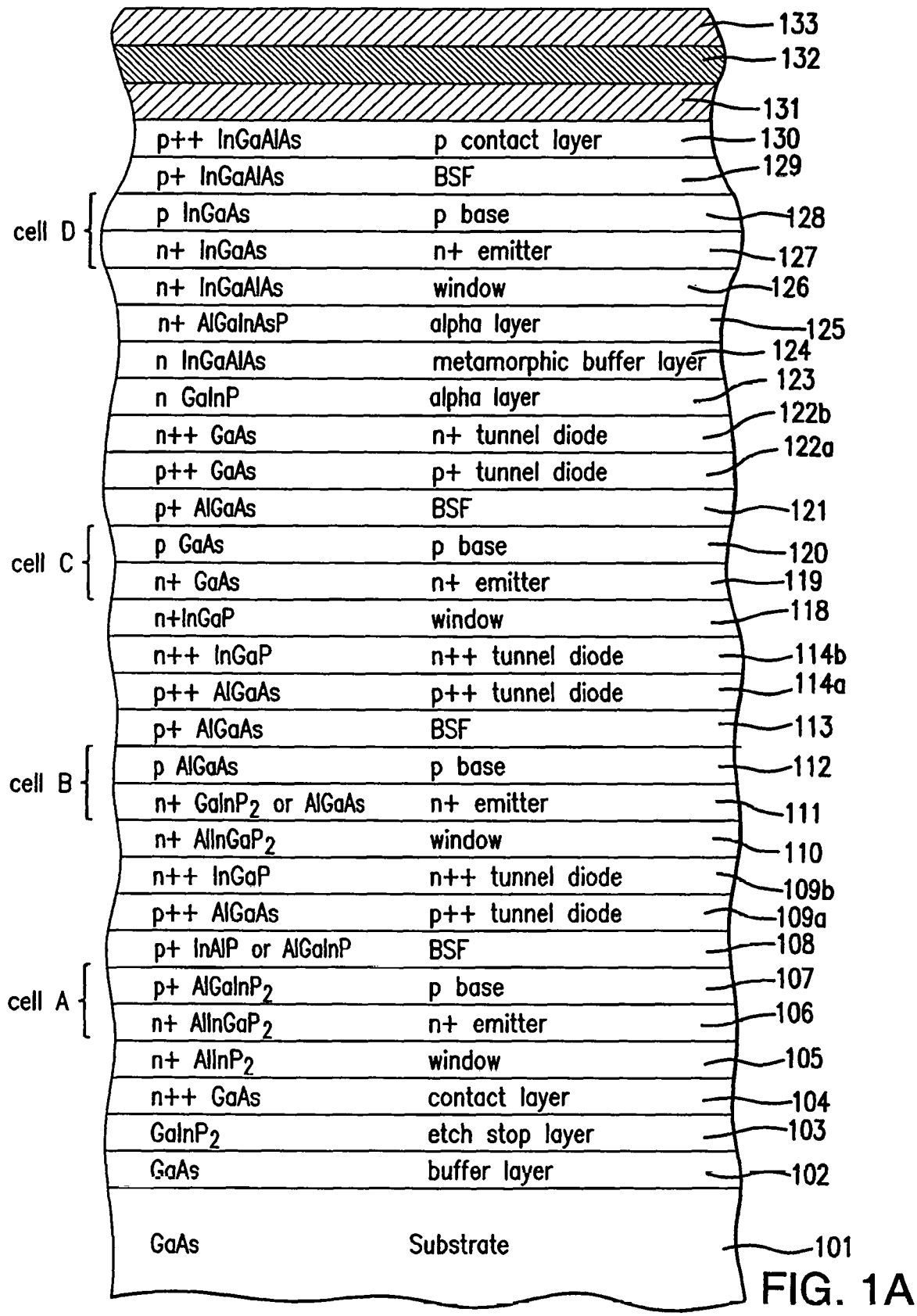
FIG. 1A is a cross-sectional view of a four Junction solar cell after an initial stage of fabrication including the deposition of certain semiconductor layers on the growth substrate; according to the present disclosure.

"III-V compound semiconductor" refers to a compound semiconductor formed using at least one elements from group III of the periodic table and at least one element from group V of the periodic table. III-V compound semiconductors include binary, tertiary and quaternary compounds. Group III includes boron (B), aluminum (Al), gallium (Ga), indium (In) and thallium (T). Group V includes nitrogen (N), phosphorus (P), arsenic (As), antimony (Sb) and bismuth (Bi).

"Band gap" refers to an energy difference (e.g., in electron volts (eV)) separating the top of the valence band and the bottom of the conduction band of a semiconductor material.

"Beginning of Life (BOL)" refers to the time at which a photovoltaic power system is initially deployed in operation.

"Compound semiconductor" refers to a semiconductor formed using two or more chemical elements.

"Current density" refers to the short circuit current density $J_{sc}$ through a solar subcell through a given planar area, or volume, of semiconductor material constituting the solar subcell.

"End of Life (EOL)" refers to a predetermined time or times after the Beginning of Life, during which the photovoltaic power system has been deployed and has been operational. The EOL time or times may, for example, be specified by the customer as part of the required technical performance specifications of the photovoltaic power system to allow the solar cell designer to define the solar cell subcells and sublayer compositions of the solar cell to meet the technical performance requirement at the specified time or times, in addition to other design objectives. The terminology "EOL" is not meant to suggest that the photovoltaic power system is not operational or does not produce power after the EOL time.

"Graded interlayer" (or "grading interlayer")—see "metamorphic layer".

"Lattice matched" refers to two adjacently disposed materials having substantially the same lattice constants.

"Lattice mismatched" refers to two adjacently disposed materials having different lattice constants from one another.

"Low intensity low temperature (LILT)" environment refers to a light intensity being less than 0.1 suns, and temperatures being in the range less than minus 100 degrees Centigrade.

"Metamorphic layer" or "graded interlayer" refers to a layer that achieves a gradual transition in lattice constant generally throughout its thickness in a semiconductor structure.

"Solar cell" refers to an electronic device operable to convert the energy of light directly into electricity by the photovoltaic effect.

"Solar cell assembly" refers to two or more solar cell subassemblies interconnected electrically with one another.

"Short circuit current ($J_{sc}$)" refers to the amount of electrical current through a solar cell or solar subcell when the voltage across the solar cell is zero measured, for example, in milliamps.

"Short circuit current density"—see "current density".

"Solar cell subassembly" refers to a stacked sequence of layers including one or more solar subcells.

"Solar subcell" refers to a stacked sequence of layers including a p-n photoactive junction composed of semiconductor materials. A solar subcell is designed to convert photons over different spectral or wavelength bands to electrical current.

"Substantially current matched" refers to the short circuit current through adjacent solar subcells which are substantially identical (i.e. plus or minus 1%).

"ZTJ" refers to a commercially available SolAero Technologies Corp. triple junction solar cell.

DESCRIPTION OF THE PREFERRED EMBODIMENTS

Details of the present disclosure will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

A variety of different features of multi junction solar cells and inverted metamorphic multijunction solar cells are disclosed in the related applications noted above. Some, many or all of such features may be included in the structures and processes associated with the solar cells of the present disclosure. However, more particularly, the present disclosure is directed, in various aspects, to a particular arrangement of semiconductor layers to provide a novel multijunction solar cells and solar cell assemblies.

A variety of different features of multijunction solar cells (including inverted metamorphic multijunction solar cells) are disclosed in the related applications noted above. In some implementations, some or all of such features may be included in the structures and processes associated with the lattice matched or "upright" solar cell assemblies of the present disclosure.

The present disclosure may be adapted to inverted metamorphic multijunction solar cells that include, for example, three, four, five, or six subcells.

The present disclosure describes a process for the fabrication of multijunction solar cells that, in some instances, improve light capture in the associated subcell and thereby the overall efficiency of the solar cell. More specifically, the present disclosure describes a relatively simple and reproducible technique that is suitable for use in a high volume production environment in which various semiconductor layers are deposited in an MOCVD reactor, and subsequent processing steps are defined and selected to minimize any physical damage to the quality of the deposited layers, thereby ensuring a relatively high yield of operable solar cells meeting specifications at the conclusion of the fabrication processes.

Prior to describing the specific embodiments of the present disclosure, a brief discussion of some of the issues associated with the design of multijunction solar cells, and in particular inverted metamorphic solar cells, and the context of the composition or deposition of various specific layers in embodiments of the product as specified and defined by the Applicant is in order.

There are a multitude of properties that should be considered in specifying and selecting the composition of, inter alia, a specific semiconductor layer, the back metal layer, the adhesive or bonding material, or the composition of the supporting material for mounting a solar cell thereon. For example, some of the properties that should be considered when selecting a particular layer or material are electrical properties (e.g. conductivity), optical properties (e.g., band gap, absorbance and reflectance), structural properties (e.g., thickness, strength, flexibility, Young's modulus, etc.), chemical properties (e.g., growth rates, the "sticking coefficient" or ability of one layer to adhere to another, stability of dopants and constituent materials with respect to adjacent layers and subsequent processes, etc.), thermal properties (e.g., thermal stability under temperature changes, coefficient of thermal expansion), and manufacturability (e.g., availability of materials, process complexity, process variability and tolerances, reproducibility of results over high volume, reliability and quality control issues).

In view of the trade-offs among these properties, it is not always evident that the selection of a material based on one of its characteristic properties is always or typically "the best" or "optimum" from a commercial standpoint or for Applicant's purposes. For example, theoretical. studies may suggest the use of a quaternary material with a certain band gap for a particular subcell would be the optimum choice for that subcell layer based on fundamental semiconductor physics. As an example, the teachings of academic papers and related proposals for the design of very high efficiency (over 40%) solar cells may therefore suggest that a solar cell designer specify the use of a quaternary material (e.g., InGaAsP) for the active layer of a subcell few such devices may actually be fabricated by other researchers, efficiency measurements made, and the results published as an example of the ability of such researchers to advance the progress of science by increasing the demonstrated efficiency of a compound semiconductor multijunction solar cell. Although such experiments and publications are of "academic" interest, from the practical perspective of the Applicants in designing a compound semiconductor multijunction solar cell to be produced in high volume at reasonable cost and subject to manutucturing tolerances and variability inherent. in the production processes, such an "optimum" design from an academic perspective is not necessarily the most desirable design in practice, and the teachings of such studies more likely than not point in the wrong direction and lead away from the proper design direction. Stated another way, such references may actually "teach away" from Applicant's research efforts and the ultimate solar cell design proposed by the Applicants.

In view of the foregoing, it is further evident that the identification of one particular constituent element (e.g. indium, or aluminum) in a particular subcell, or the thickness, band gap, doping, or other characteristic of the incorporation of that material in a particular subcell, is not a "result effective variable" that one skilled in the art can simply specify and incrementally adjust to a particular level. and thereby increase the efficiency of a solar cell. The efficiency of a solar cell is not a simple linear algebraic equation as a function of the amount of gallium or aluminum or other element in a particular layer. The growth of each of the epitaxial layers of a solar cell in an MOCVD reactor is a non-equilibrium thermodynamic process with dynamically changing spatial and temporal boundary conditions that is not readily or predictably modeled. The formulation and solution of the relevant simultaneous partial differential equations covering such processes are not within the ambit of those of ordinary skill in the art in the field of solar cell design.

Even when it is known that particular variables have an impact on electrical, optical, chemical, thermal or other characteristics, the nature of the impact. often cannot be predicted with much accuracy, particularly when the variables interact in complex ways, leading to unexpected results and unintended consequences. Thus, significant trial and error, which may include the fabrication and evaluative testing of many prototype devices, often over a period of time of months if not years, is required to determine whether a proposed structure with layers of particular compositions, actually will operate as intended, let alone whether it can be fabricated in a reproducible high volume manner within the manufacturing tolerances and variability inherent in the production process, and necessary for the design of a commercially viable device.

Furthermore, as in the case here, where multiple variables interact in unpredictable ways, the proper choice of the combination of variables can produce new and unexpected results, and constitute an "inventive step".

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), or other vapor deposition methods for the growth may enable the layers in the monolithic semiconductor structure forming the cell to be grown with the required thickness, elemental composition, dopant concentration and grading and conductivity type.

The growth processes for the solar cells described here can use, for example, a MOCVD process in a standard, commercially available reactor suitable for high volume production. The processes can be particularly suitable for producing commercially viable multijunction solar cells or inverted metamorphic multijunction solar cells using commercially available equipment and established high-volume fabrication processes, as contrasted with merely academic expositions of laboratory or experimental results.

Layers of a certain target composition in a semiconductor structure gown in an MOCVD process are inherently physically different than the layers of an identical target composition grown by another process, e.g. Molecular Beam Epitaxy (MBE). The material quality (i.e., morphology, stoichiometry, number and location of lattice traps, impurities, and lattice defects) of an epitaxial layer in a semiconductor structure is different depending upon the process used to grow the layer, as well as the process parameters associated with the growth. MOCVD is inherently a chemical reaction process, while MBE is a physical deposition process. The chemicals used in the MOCVD process are present in the MOCVD reactor and interact with the wafers in the reactor, and affect the composition, doping, and other physical, optical and electrical characteristics of the material. For example, the precursor gases used in an MOCVD reactor (e.g. hydrogen) are incorporated into the resulting processed wafer material, and have certain identifiable electro-optical consequences which are more advantageous in certain specific applications of the semiconductor structure, such as in photoelectric conversion in structures designed as soar cells. Such high order effects of processing technology do result in relatively minute but actually observable differences in the material quality grown or deposited according to one process technique compared to another. Thus, devices fabricated at least in part using an MOCVD reactor or using a MOCVD process have inherent different physical material characteristics, which may have an advantageous effect over the identical target material deposited using alternative processes.

In some cases, the solar cell according to the present application and present disclosure can provide increased photoconversion efficiency in a multijunction solar cell for outer space or other applications over the operational life of the photovoltaic power system.

A 33% efficient quadruple junction InGaP$_2$/GaAs/In$_{0.30}$Ga$_{0.70}$As/In$_{0.60}$Ga$_{0.40}$As (with band gaps 1.91 eV/1.42 eV/1.03 eV/0.70 eV, respectively) inverted metamorphic multijunction cell may be 10% (relative) more efficient at beginning of life (BOL) than standard ZTJ triple-junction devices and have 40% lower mass when permanently bonded to a 150 nm thick low-mass rigid substrate. Further, inverted metamorphic technology may extend the choice of materials that can be integrated together by making possible simultaneous realization of high quality materials that are both lattice-matched to the substrate (InGaP and GaAs, grown first) and lattice-mismatched (In$_{0.30}$Ga$_{0.70}$As and In$_{0.60}$Ga$_{0.40}$As). The advantage of a metamorphic approach may be that a wide range of infrared bandgaps may be accessed via InGaAs subcells grown atop optically transparent step graded buffer layers. Further, metamorphic materials may offer near-perfect quantum efficiencies, favorably low $E_G$-$V_{oc}$ offsets, and high efficiencies. As may often be the case though, efficiency gains may rarely materialize without additional costs. For example, a quadruple junction (or "4J") inverted metamorphic multijunction cell may be more costly than a ZTJ due to thicker epitaxy and more complicated processing. Further, an inverted epitaxial foil may be removed from the growth substrate and temporarily or permanently bonded to a rigid substrate ti t-side-up to complete frontside processing. Still further, the result may be an all-top-contact cell that may be largely indistinguishable from a traditional ZTJ solar cell. Yet despite the quadruple-junction inverted metamorphic multijunction cell being a higher efficiency, lower mass drop-in replacement for ZTJ, the higher specific cost [measured in $/Watt] may discourage customers from adopting new or incrementally modified cell technologies.

The inverted metamorphic quadruple junction AlInGaP/AlGaAs/GaAs/InGaAs (with band gaps 2.1 eV/1.73 eV/1.42 eV/11.10 eV respectively) solar cell, or the five junction AlInGaPlAlGaAs/GaAs/InCiaAslinGaAs (with band gaps 2.1 eV/1.73 eV/1.42 eV/1.10 eV/0.90 eV) according to the present disclosure, is not a design that agrees with the conventional wisdom in that an optimized multijunction cell should have balanced photocurrent generation among all subcells and use the entire solar spectrum including the infrared spectrum from 1200 nm-2000 nm. In this disclosure, a high bandgap current-matched triple-junction stack may be gown first followed by a lattice-mismatched 1.10 eV InGaAs subcell, which in one embodiment, forms the "bottom" subcell. The inverted InGaAs subcell is subsequently removed from the growth substrate and bonded to a rigid carrier so that the four junction or five junction solar cell can then be processed as a normal solar cell.

Despite the beginning of life (BOL) efficiency being lower than the traditional inverted metamorphic quadruple-junction solar cell, when high temperature end of life (hereinafter referred to as "HT-EOL") VW is used as the desi metric, the proposed structure may provide a 10% increase in HT-EOL power and a significant decrease in HT-EOL $/W.

The proposed technology differs from existing art (e.g., U.S. Pat. No. 8,969,712 B2) in that a four junction device is constructed as described in the parent application using three lattice-matched subcells and one lattice-mismatched subcell, and three lattice matched subcells and two lattice-mismatched subcells. Previous inverted metamorphic quadruple-junction solar cells devices were constructed using two lattice-matched subcells and two lattice mismatched subcells. As a result, the cost of the epitaxy of the proposed architecture may be cheaper as the cell, e.g., may use a thinner top cell reducing In and P usage, may reduce the number of graded buffer layers to one from two, and may eliminate the need for a high In content bottom cell, which may be expensive due to the quantity of in required.

The basic concept of fabricating an inverted metamorphic multijunction (IMM) solar cell is to grow the subcells of the solar cell on a substrate in a "reverse" sequence. That is, the high band gap subcells (i.e. subcells with band gaps in the range of 1.9 to 2.3 eV), which would normally be the "top" subcells facing the solar radiation, are grown epitaxially on a semiconductor growth substrate, such as for example GaAs or Ge, and such subcells are therefore lattice-matched to such substrate. One or more lower band gap middle subcells (i.e. with band gaps in the range of 1.3 to 1.9 eV) can then be grown on the high band gap subcells.

At least one lower subcell is formed over the middle subcell such that the at least one lower subcell is substantially lattice-mismatched with respect to the growth substrate and such that the at least one lower subcell has a third lower band gap (e.g., a band gap in the range of 0.8 to 1.2 eV). A surrogate substrate or support structure is then attached or provided over the "bottom" or substantially lattice-mismatched lower subcell, and the growth semiconductor substrate is subsequently removed. (The growth substrate may then subsequently be re-used for the growth of a second and subsequent solar cells).

A variety of different features of inverted metamorphic multijunction solar cells are disclosed in the related applications noted above. Some or all of such features may be included in the structures and processes associated with the solar cells of the present disclosure. However, more particularly, the present disclosure is directed to the fabrication of a four junction inverted metamorphic solar cell using two different metamorphic layers, all grown on a single growth substrate. In the present disclosure, the resulting construction includes five subcells, with band gaps in the range of 1.92 to 2.2 eV (e.g., 2.10 eV), 1.65 to 1.78 eV (e.g., 1.73 eV), 1.42 to 1.50 eV (e.g., 1.42 eV), 1.05 to 1.15 eV (e.g., 1.10 eV), and 0.8 to 0.9 eV respectively.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OWVPE), Metal Organic Chemical Vapor Deposition (MOCVD), Molecular Beam Epitaxy (MBE), or other vapor deposition methods for the reverse growth may enable the layers in the monolithic semiconductor structure forming the cell to be grown with the required thickness, elemental composition, dopant concentration and grading and conductivity type.

FIG. 1A depicts a four junction multifunction solar cell according to a first embodiment of the present disclosure after the sequential formation of the four subcells A, B, C, and D on a GaAs growth substrate. More particularly, there is shown a growth substrate 101, which is preferably gallium arsenide (GaAs), but may also be germanium (Ge) or other suitable material. For GaAs, the substrate is preferably a 15° off-cut substrate, that is to say, its surface is orientated 15° off the (100) plane towards the (111)A plane, as more fully described in U.S. Patent Application Pub. No. 2009/0229662 A1 (Stan et al.).

In the case of a Ge substrate, a nucleation layer (not shown) is deposited directly on the substrate 101. On the substrate, or over the nucleation layer (in the case of a Ge substrate), a buffer layer 102 and an etch stop layer 103 are further deposited. In the case of GaAs substrate, the buffer layer 102 is preferably GaAs. In the case of Ge substrate, the buffer layer 102 is preferably InGaAs, A contact layer 104 of GaAs is then deposited on layer 103, and a window layer 105 of AlInP is deposited on the contact layer. The subcell A, consisting of an n+ emitter layer 106 and a p-type base layer 107, is then epitaxially deposited on the window layer 105. The subcell A is generally latticed matched to the growth substrate 101.

It should be noted that the multijunction solar cell structure could be formed by any suitable combination of group III to V elements listed in the periodic table subject to lattice constant and bandgap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorous (P), arsenic (As), antimony (Sb), and bismuth (Bi).

In one embodiment, the emitter layer 106 is composed of InGa(Al)P$_2$ and the base layer 107 is composed of InGa(Al)P$_2$. The aluminum or Al term in parenthesis in the preceding formula means that Al is an optional constituent, and in this instance may be used in an amount ranging from 0% to 40%.

Subcell A will ultimately become the "top" subcell of the inverted metamorphic structure after completion of the process steps according to the present disclosure to be described hereinafter.

On top of the base layer 107 a back surface field ("BSF") layer 108 preferably p+ AlGaInP is deposited and used to reduce recombination loss.

The BSF layer 108 drives minority carriers from the region near the base/BSF interface surface to minimize the effect of recombination loss. In other words, a BSF layer 108 reduces recombination loss at the backside of the solar subcell A and thereby reduces the recombination in the base.

On top of the BSF layer 108 is deposited a sequence of heavily doped p-type and n-type layers 109a and 109b that forms a tunnel diode, i.e., an ohmic circuit element that connects subcell A to subcell B. Layer 109a is preferably composed of p++ AlGaAs, and layer 109b is preferably composed of n++ InGaP.

A window layer 110 is deposited on top of the tunnel diode layers 109a/109b, and is preferably n+ InGaP. The advantage of utilizing InGaP as the material constituent of the window layer 110 is that it has an index of refraction that closely matches the adjacent emitter layer 111, as more fully described in U.S. Patent Application Pub. No. 2009/0272430 A1 (Cornfeld et al.). The window layer 110 used in the subcell B also operates to reduce the interface recombination loss. It should be apparent to one skilled in the art, that additional layer(s) may be added or deleted in the cell structure without departing from the scope of the present disclosure.

On top of the window layer 110 the layers of subcell B are deposited: the n-type emitter layer 111 and the p-type base layer 112. These layers are preferably composed of InGaP and AlInGaAs respectively (for a Ge substrate or growth template), or InGaP and AlGaAs respectively (for a GaAs substrate), although any other suitable materials consistent with lattice constant and bandgap requirements may be used as well. Thus, subcell B may be composed of a GaAs, InGaP, AlGaInAs, AlGaAsSb, GaInAsP, or AlGaInAsP, emitter region and a GaAs, InGaP, AlGaInAs, AlGaAsSb, GaInAsP, or AlGaInAsP base region.

In previously disclosed implementations of an inverted metamorphic solar cell, the second subcell or subcell B or was a homostructure. In the present disclosure, similarly to the structure disclosed in U.S. Patent Application Pub. No. 2009/0078310 A1 (Stan et al.), the second subcell or subcell B becomes a heterostructure with an InGaP emitter and its window is converted from InAlP to AlInGaP. This modification reduces the refractive index discontinuity at the window/emitter interface of the second subcell, as more fully described in U.S. Patent Application Pub. No. 2009/0272430 A1 (Cornfeld et al.). Moreover, the window layer 110 is preferably is doped three times that of the emitter 111 to move the Fermi level up closer to the conduction band and therefore create band bending at the window/emitter interface which results in constraining the minority carriers to the emitter layer.

On top of the cell B is deposited a BSF layer 113 which performs the same function as the BSF layer 109. The p++/n++ tunnel diode layers 114a and 114b respectively are deposited. over the BSF layer 113, similar to the layers 109a and 109b, forming an ohmic circuit element to connect subcell B to subcell C. The layer 114a is preferably composed of p++ AlGaAs, and layer 114b is preferably composed of n++ InGaP.

A window layer 118 preferably composed of n+ type Gala is then deposited over the tunnel diode layer 114. This window layer operates to reduce the recombination loss in subcell "C". it should be apparent to one skilled in the art that additional layers may be added or deleted in the cell structure without departing from the scope of the present disclosure.

On top of the window layer 118, the layers of cell C are deposited: the n+ emitter layer 119, and the p-type base layer 120. These layers are preferably composed of n+ type GaAs and n+ type GaAs respectively, or n+ type InGaP and p type GaAs for a heterojunction subcell, although another suitable materials consistent with lattice constant and bandgap requirements may be used as well.

In some embodiments, subcell C may be (In)GaAs with a band gap between 1.40 eV and 1.42 eV. Grown in this manner, the cell has the same lattice constant as GaAs but has a low percentage of Indium 0%<In<1% to slightly lower the band gap of the subcell without causing it to relax and create dislocations. In this case, the subcell remains lattice matched, albeit strained, and has a lower band gap than GaAs. This helps improve the subcell short circuit current slightly and improve the efficiency of the overall solar cell.

In some embodiments, the third subcell or subcell C may have quantum wells or quantum dots that effectively lower the band gap of the subcell to approximately 1.3 eV. All other band gap ranges of the other subcells described above remain the same. In such embodiment, the third subcell is still lattice matched to the GaAs substrate. Quantum wells are typically "strain balanced" by incorporating lower band gap or larger lattice constant InGaAs (e.g. a band gap of ~1.3 eV) and higher band gap or smaller lattice constant GaAsP. The larger/smaller atomic lattices/layers of epitaxy balance the strain and keep the material lattice matched.

A BSF layer 121, preferably composed of InGaAlAs, is then deposited on top of the cell C, the BSF layer performing the same function as the BSF layers 108 and 113.

The p++/n++ tunnel diode layers 122a and 122b respectively are deposited over the EISF layer 121, similar to the layers 114a and 114b, forming an ohmic circuit element to connect subcell C to subcell D. The layer 122a is preferably composed of p++ GaAs, and layer 122b is preferably composed of n++ GaAs.

An alpha layer 123, preferably composed of retype GaInP, is deposited over the tunnel diode 122a/122b, to a thickness of about 1.0 micron. Such an alpha layer is intended to prevent threading dislocations from propagating, either opposite to the direction of growth into the top and middle subcells A, B and C, or in the direction of growth into the subcell D, and is more particularly described in U.S. Patent Application Pub. No. 2009/0078309 A1 (Cornfeld et al.).

A metamorphic layer (or graded interlayer) 124 is deposited over the alpha layer 123 using a surfactant. Layer 124 is preferably a compositionally step-graded series of InGaAlAs layers, preferably with monotonically changing lattice constant, so as to achieve a gradual transition in lattice constant in the semiconductor structure from subcell C to subcell D while minimizing threading dislocations from occurring. The band gap of layer 124 is constant throughout its thickness, preferably approximately equal to 1.5 to 1.6 eV, or otherwise consistent with a value slightly greater than the band gap of the middle subcell C. One embodiment of the graded interlayer may also be expressed as being composed of $(In_xGa_{1-x})_yAl_{1-y}As$, with x and y selected such that the band gap of the interlayer remains constant at approximately 1.5 to 1.6 eV or other appropriate band gap.

In the surfactant assisted growth of the metamorphic layer 124, a suitable chemical element is introduced into the reactor during the growth of layer 124 to improve the surface characteristics of the layer. In the preferred embodiment, such element may be a dopant or donor atom such as selenium (Se) or tellurium (Te). Small amounts of Se or Te are therefore incorporated in the metamorphic layer 124, and remain in the finished solar cell. Although Se or Te are the preferred n-type dopant atoms, other non-isoelectronic surfactants may be used as well.

Surfactant assisted growth results in a much smoother or planarized surface. Since the surface topography affects the bulk properties of the semiconductor material as it grows and the layer becomes thicker, the use of the surfactants minimizes threading dislocations in the active regions, and therefore improves overall solar cell efficiency.

As an alternative to the use of non-isoelectronic one may use an isoelectronic surfactant. The term "isoelectronic" refers to surfactants such as antimony (Sb) or bismuth (Bi), since such elements have the same number of valence electrons as the P atom of InGaP, or the As atom in InGaAlAls, in the metamorphic buffer layer. Such Sb or Bi surfactants will not typically be incorporated into the metamorphic layer 124.

In the inverted metamorphic structure described in the Wanlass et al. paper cited above, the metamorphic layer consists of nine compositionally graded InGaP steps, with each step layer having a thickness of 0.25 micron. As a result, each layer of Wanlass et al. has a different bandgap. In one of the embodiments of the present disclosure, the layer 124 is composed of a plurality of layers of InGaAlAs, with monotonically changing lattice constant, each layer having the same band gap, approximately in the range of 1.5 to 1.6 eV.

The advantage of utilizing a constant bandgap material such as InGaAlAs is that arsenide-based semiconductor material is much easier to process in standard commercial MOCVD reactors, while the small amount of aluminum assures radiation transparency of the metamorphic layers.

Although the preferred embodiment of the present disclosure utilizes a plurality of layers of InGaAlAs for the metamorphic layer 124 for reasons of manufacturability and radiation transparency, other embodiments of the present disclosure may utilize different material systems to achieve a change in lattice constant from subcell C to subcell D. Thus, the system of Wanlass using compositionally graded InGaP is a second embodiment of the present disclosure. Other embodiments of the present disclosure may utilize continuously graded, as opposed to step graded, materials. More generally, the graded interlayer may be composed of any of the As, P, N, Sb based III-V compound semiconductors subject to the constraints of having the in-plane lattice parameter greater than or equal to that of the second solar cell and less than or equal to that of the third solar cell, and having a bandgap energy greater than that of the second solar cell.

An alpha layer 125, preferably composed of n+ type AlGaInAsP, is deposited over metamorphic buffer layer 124, to a thickness of about 1.0 micron. Such an alpha layer is intended to prevent threading dislocations from propagating, either opposite to the direction of growth into the top and middle subcells A, B and C, or in the direction of growth into the subcell D, and is more particularly described in U.S. Patent Application Pub. No. 2009/0078309 A1 (Cornfeld et al.).

A window layer 126 preferably composed of n+ type InGaAlAs is then deposited over alpha layer 125. This window layer operates to reduce the recombination loss in the fourth subcell "D". It should be apparent to one skilled in the art that additional layers may be added or deleted in the cell structure without departing from the scope of the present disclosure.

On top of the window layer 126, the layers of cell D are deposited: the n+ emitter layer 127, and the p-type base layer 128. These layers are preferably composed of n+ type InGaAs and p type InGaAs respectively, or n+ type InGaP and p type InGaAs for a heterojunction subcell, although another suitable materials consistent with lattice constant and bandgap requirements may be used as well.

A BSF layer 129, preferably composed of p+ type InGaAlAs, is then deposited on top of the cell D, the BSF layer performing the same function as the BSF layers 108, 113 and 121.

Finally, a high band gap contact layer 130, preferably composed of p++ type AlGaInAs, is deposited on the BSF layer 129.

The composition of this contact layer 130 located at the bottom (non-illuminated) side of the lowest band gap photovoltaic cell (i.e., subcell "D" in the depicted embodiment) in a multifunction photovoltaic cell, can be formulated to reduce absorption of the light that passes through the cell, so that (i) the backside ohmic metal contact layer below it (on the non-illuminated side) will also act as a mirror layer, and (ii) the contact layer doesn't have, to be selectively etched. off, to prevent absorption.

In some embodiments, a diffusion barrier layer 131 composed of one or more layers of either Cr, Pd, Pt, Si, Ti, or TiN to a thickness from 0.1 to 10 nm is deposited on the semiconductor contact layer 130. In some embodiments the thickness of such layer may be (i) from 0.1 to 2.5 nm, or (ii) from 0.1 ml to 5 nm.

A reflective metal layer 132 is then deposited on the diffusion barrier layer 131, or in some embodiments directly on the semiconductor contact layer 130. The reflective metal layer 132 is composed of any one or more of the following metals or alloys thereof: Al, Be, and Ni is deposited to a thickness between 50 nm and 5 microns over said semiconductor contact layer, (or in some embodiments one or more of Ag, Al, An, Be, Cu, Mo and Ni or alloys thereof), such that the reflectivity of the reflective metal layer is greater than 80% in the wavelength range 850-2000 nm.

A contact metal layer 133 composed of one or more layers of Ag, Au, and Ti, is then deposited on the reflective metal layer 132. A surrogate substrate is then mounted on top of the contact metal layer 133, and the growth substrate is removed, as will be illustrated in FIG. 1B.

It should be apparent to one skilled in the art, that additional layer(s) may be added or deleted in the cell structure without departing from the scope of the present invention.

Figure 1B:
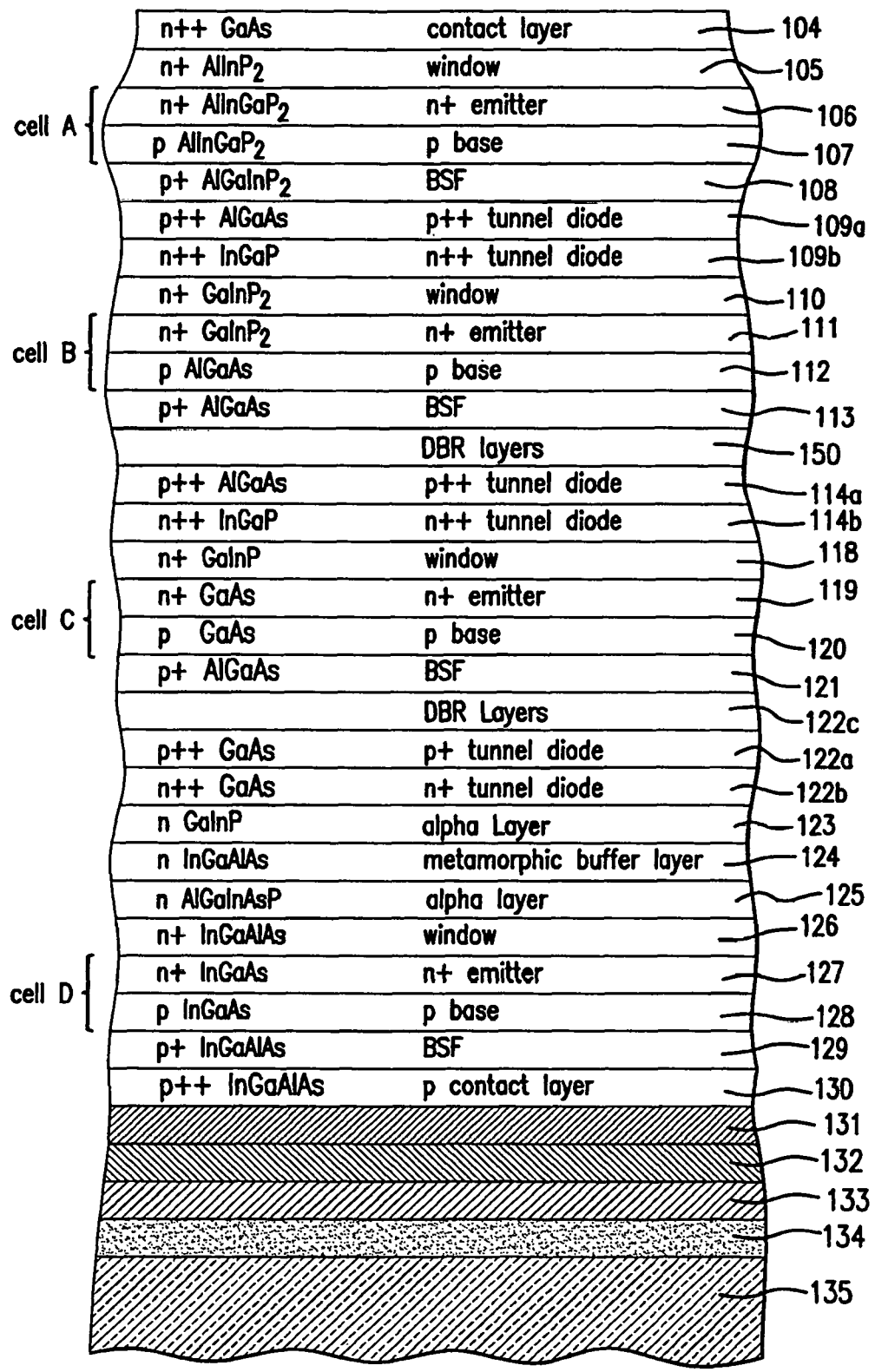
FIG. 1B is a cross-sectional view of the solar cell of FIG. 1A with the orientation of the metal contact layer being at the bottom of the Figure.

FIG. 1B is a cross-sectional view of the solar cell of FIG. 1A with the orientation of the metal contact layer being at the bottom of the Figure so that the subcell A is the light facing or top subcell of the solar cell. The figure also illustrates the surrogate or supporting substrate 135 mounted or bonded to the contact metal layer 133 by an adhesive or other bonding material 134.

The adhesive layer (e.g., Wafer Bond, manufactured by or supporting Brewer Science, Inc. of Rolla, Mo.) can be deposited over the metal layer 131, and a surrogate or supporting substrate 135 can thereby be attached to the contact metal layer 133. In some embodiments, the supporting substrate may be sapphire or glass. In other embodiments, the surrogate or supporting substrate may be GaAs, Ge or Si, or other suitable material. The surrogate substrate can be about 40 mils in thickness, and can be perforated with holes about 1 mm diameter, spaced 4 mm apart, to aid in subsequent removal of the adhesive and the substrate. As an alternative to using an adhesive layer 134, a suitable substrate (e.g., GaAs) may be eutectically or permanently bonded to the metal layer 131.

The growth substrate 101 can be removed by a sequence of lapping and/or etching steps in which the substrate 101, and the buffer layer 102 are removed. The choice of a particular etchant is growth substrate dependent.

FIG. 1B depicts the growth substrate 101 having been removed. In addition, the buffer layer 102 and etch stop layer 103 have been removed, for example, by using a $HC_1/H_2O$ solution.

It should be apparent to one skilled in the art, that additional layer(s) may be added or deleted in the cell structure without departing from the scope of the present disclosure. For example, one or more distributed Bragg reflector (DBR) layers can be added for various embodiments of the present invention, and FIG. 1B illustrates the positioning of DBR layers 150 between the BSF layer 113 and the tunnel diode layers 114a/114b.

Figure 2A:
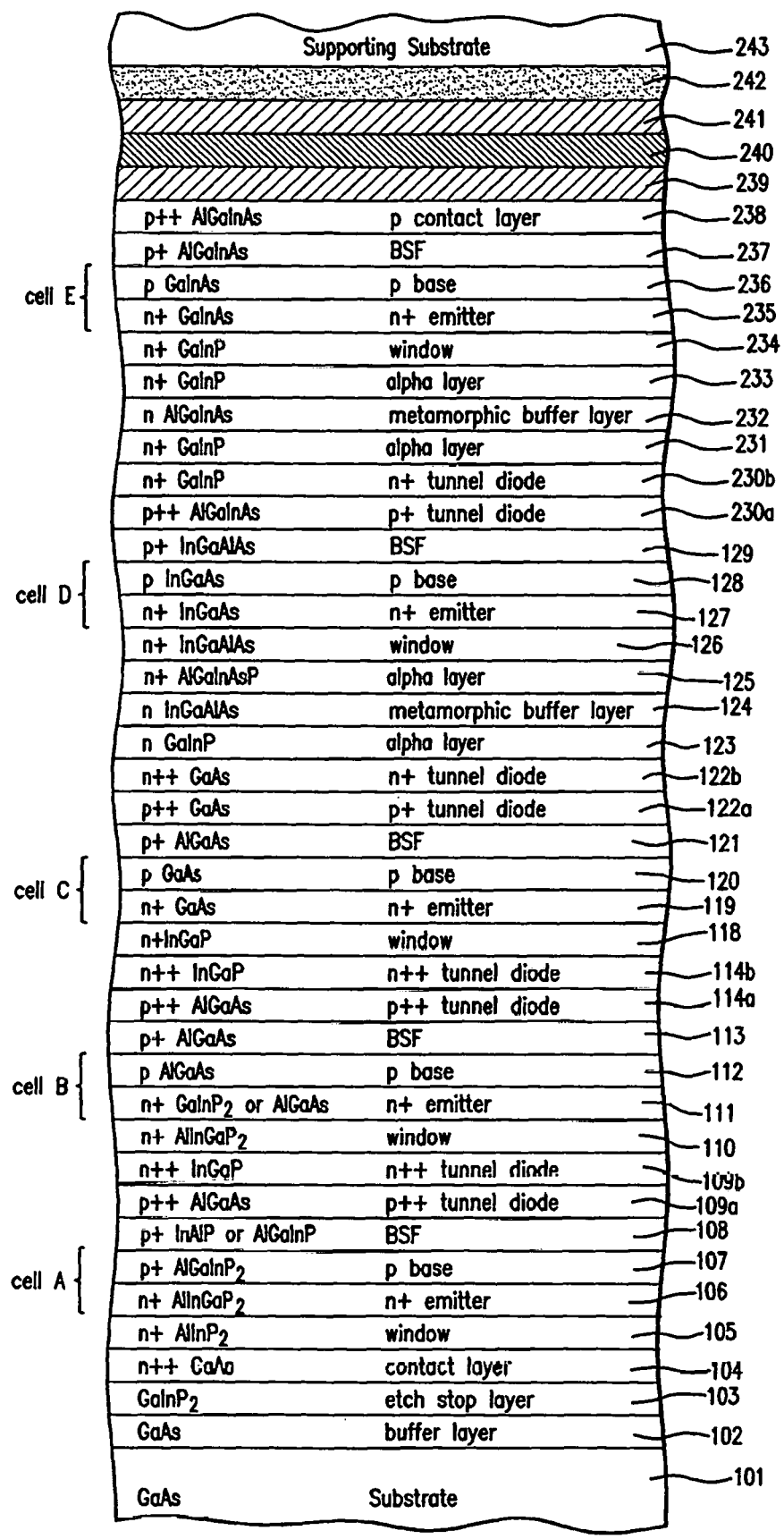
FIG. 2A is a cross-sectional view of a five junction solar cell after an initial stage of fabrication including the deposition of certain semiconductor layers on the growth substrate; according to the present disclosure.

FIG. 2A is a cross-sectional view of a five junction solar cell after an initial stage of fabrication including the deposition of certain semiconductor layers on the growth substrate; according to the present disclosure. In FIG. 2A layers 101, 102 . . . through 129 are substantially the same as that depicted in the corresponding layer of FIG. 1A, so the description of such layers will not be repeated here for brevity.

Turning to the new layers in FIG. 2A, the p++/n++ tunnel diode layers 230a and 230b respectively are deposited over the BSF layer 129, forming an ohmic circuit element to connect the fourth subcell D the fifth to subcell E. The layer 230a is preferably composed of p++ AlGaInAs, and layer 230b preferably composed of n++ GaInP.

In some embodiments an alpha layer 231, preferably composed of n-type GaInP, is deposited over the tunnel diode 230a/230b, to a thickness of about 0.5 micron. Such alpha layer is intended to prevent threading dislocations from propagating, either opposite to the direction of growth into the middle subcells C and D, or in the direction of growth into the subcell E, and is more particularly described in copending U.S. patent application Ser. No. 11/860,183, filed Sep. 24, 2007.

A window layer 234 preferably composed of n+ type GaInP is then deposited over the barrier layer 233. This window layer operates to reduce the recombination loss in the fifth subcell "E". it should be apparent to one skilled in the art that additional layers may be added or deleted in the cell structure without departing from the scope of the present invention.

On top of the window layer 234, the layers of cell E are deposited: the n+ emitter layer 235, and the p-type base layer 236. These layers are preferably composed of n+ type GaInAs and p type GaInAs respectively, although other suitable materials consistent with lattice constant and band gap requirements may be used as well.

A BSF layer 237, preferably composed of p+ type AlGaInAs, is then deposited on top of the cell E, the BSF layer performing the same function as the BSF layers 108, 113, 121, and 129.

Finally, a high band gap contact layer 238, preferably composed of p++ type AlGaInAs, is deposited on the BSF layer 237.

In some embodiments, a diffusion barrier layer 239 composed of one or more layers of either Cr, Pd, Pt, Si, Ti, or TiN to a thickness in the range of 2.0-4.0 nm is deposited on the semiconductor contact layer 238.

A reflective metal layer 240 is then deposited on the diffusion barrier layer 239, or in some embodiments directly on the semiconductor contact layer 238. The reflective metal layer 240 is composed of any one or more of the following metals or alloys thereof: Al, Au, Cu, Mo, Be, and Ni, and is deposited to a thickness between 50 nm and 5 microns over said semiconductor contact layer 238, such that the reflectivity of the reflective metal layer is greater than 80% in the wavelength range of 850-2000 nm.

A contact metal layer 241 composed of one or more layers of Ag, Au, and Ti, is then deposited on the reflective metal layer 132. A surrogate or supporting substrate 243 is then mounted on top of the contact metal layer 241 and the growth substrate is removed, as will be illustrated in FIG. 2B. The attachment of the surrogate or supporting substrate 243 is similar to that of the supporting substrate 135 of FIG. 1A, so such description will not be repeated here for brevity.

Figure 2B:
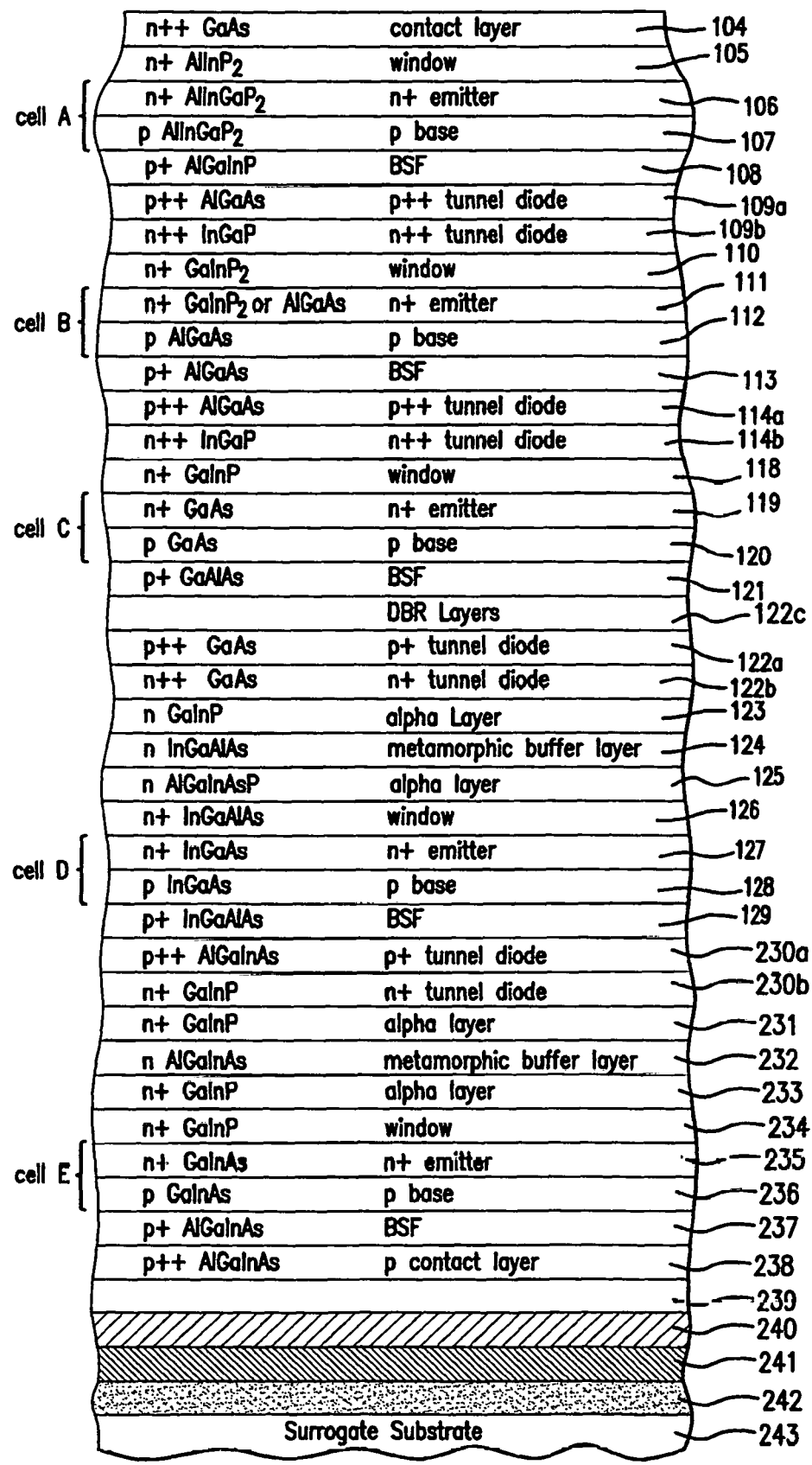
FIG. 2B is a cross-sectional view of the solar cell of FIG. 2A with the orientation of the metal contact layer being at the bottom of the figure.

FIG. 2B is a cross-sectional view of the solar cell of FIG. 2A, with the orientation with the metal contact layer 241 being at the bottom of the Figure and with the growth substrate 101 having been removed. In addition, the etch stop layer 103 has been removed, for example, by using a $HCl/H_2O$ solution.

Figure 3:
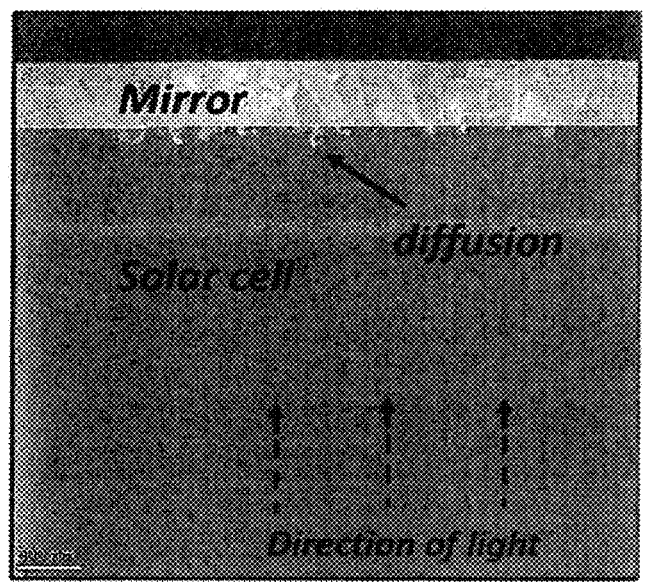
FIG. 3 is a transmission electron microscope image of a test solar cell with a deposited reflective layer.

FIG. 3 is a transmission electron microscope image of a test solar cell with a deposited reflective layer (labelled "Mirror") composed of gold. Evidence of the diffusion of constituent atoms of gold form the reflective layer into the adjacent layers of the solar cell is indicated, demonstrating the disadvantage of utilizing of certain materials suggested in Cornfeld U.S. Patent Application Publication 2011004898. Such diffusion would impair the material quality and efficiency of the subcell, and thereby the entire solar cell.

Figure 4:
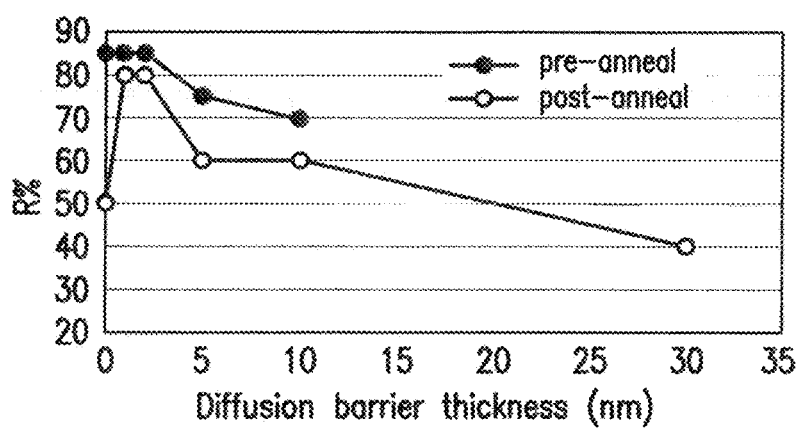
FIG. 4 is a graph that shows the reflectivity of light in a test solar cell as a function of wavelength before and after processing which entails the application of heat to the solar cell.

FIG. 4 is a graph that shows the change in reflectivity of a test mirror in a test solar cell before processing (i.e., pre-annealing) and after processing (post-annealing) of the solar cell as a function of diffusion barrier layer thickness. It is evident that without use of a diffusion barrier (i.e. a diffusion barrier thickness of 0.0 nm) the reflectivity of the test mirror drops from over 80% to about 50%. The graph also indicates that the thickness of the diffusion barrier layer also has a strong effect on reflectivity for a thickness of such layer greater than 2.5 nm.

Figure 5:
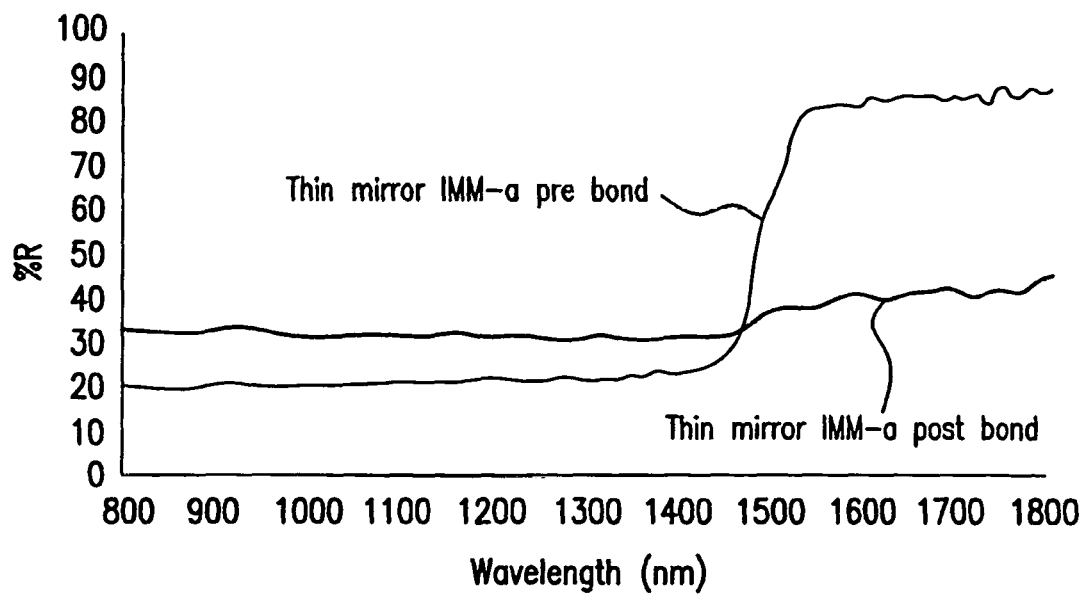
FIG. 5 is a graph that illustrates the reflectivity of light in a test solar cell with a thin mirror as a function of the wavelength of the incident light before and after processing involving the application of heat.

FIG. 5 is a graph that shows the reflectivity of light in a test solar cell with a thin mirror as a function of wavelength before and after processing which entails the application of heat to the solar cell denoted in the Figure as "pre bond" or "post bond". A substantial decrease in reflectivity from over 80% to around 40% for incident light with wavelengths over 1400 nm is noted.

Figure 6:
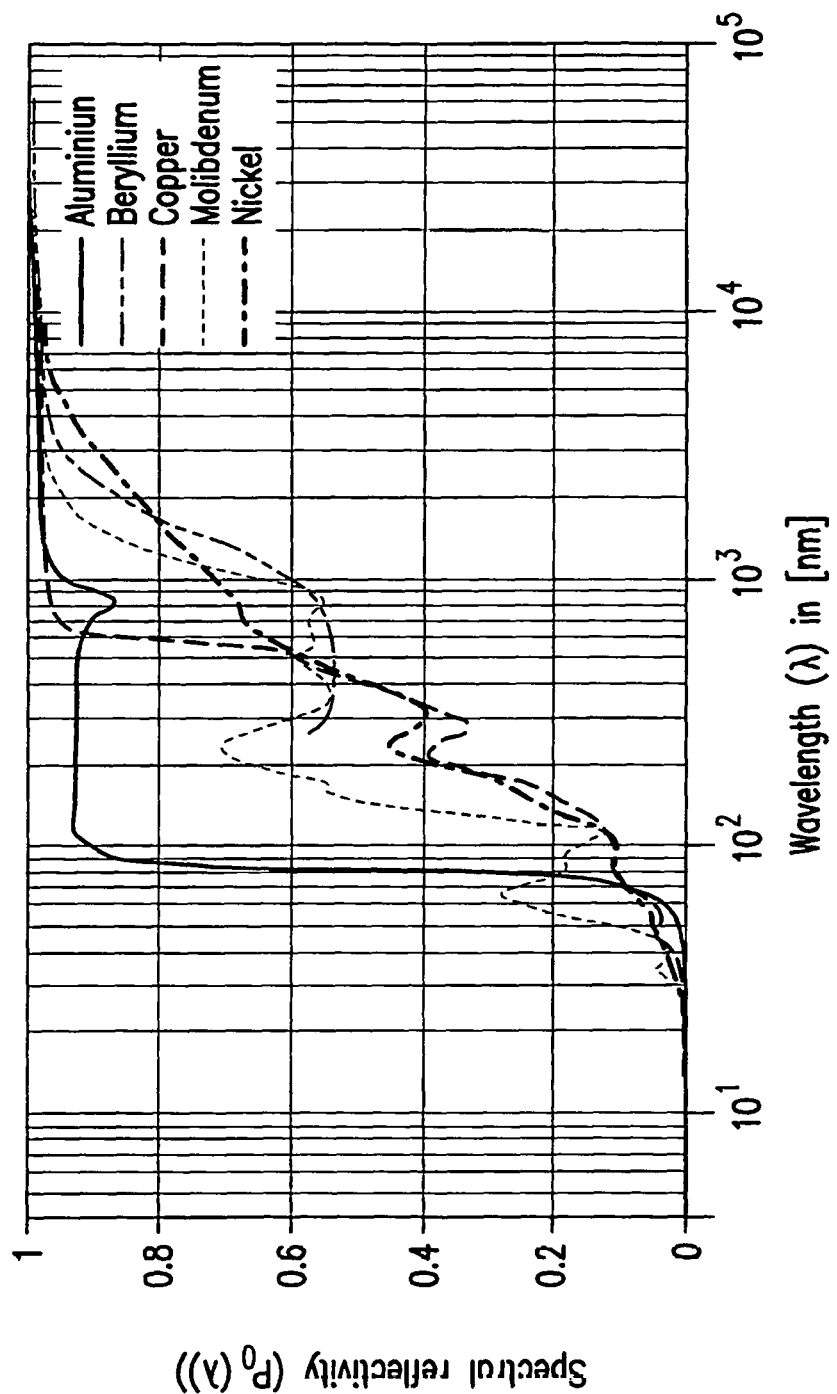
FIG. 6 is a graph that illustrates the spectral reflectivity of perfectly smooth metal surface for a sample of metals employed in the present disclosure.

FIG. 6 is a graph that illustrates the reflectivity of certain smooth metal surfaces as a function of the wavelength of the incident light.

As shown in reflectivity curves in FIG. 6, conventional inverted metamorphic multijunction (IMM) solar cells have a low reflectivity in the IR region (850-2000 nm) by virtue of the reflectivity of typical metals used in the back metal contacts used in these solar cells. This means that about 60% of the transmitted energy in absorbed as heat at the back metal contact. The present disclosure proposes utilizing a suitable mirror structure, composition and thickness for increasing the amount of IR light reflected back into the final junction so as to reduce the heat absorbed, thereby reducing the operating temperature of the solar cell which is important for optimizing the efficiency of such solar cells operating in high temperature space environment.

Additionally, a high reflectivity metal mirror as proposed in the present disclosure would result in more light energy (i.e. photons) reflected into the adjacent bottom subcell or junction which could be absorbed by this junction and converted into electricity. More absorption increases the current in this subcell's junction, which can be translated into a 9.34% increase in Quantum Efficiency (QE) of that subcell according to the use of a suitable metal mirror as proposed in the present disclosure.

Not all metals depicted in FIG. 6 (such as gold) are suitable back reflectors due to interdiffusion of the reflective metal into the solar cell junction during processing as shown in FIG. 3. Temperatures required to process solar cells can lead to both a reduction in reflectivity such as demonstrated in the experimental evidence on test solar cells depicted in FIG. 4 a result of subsequent high temperature processed used in fabrication of IMM solar cells referred to as "bond" and thereby a reduction in solar cell performance for cells with reflective metals.

Two solutions are proposed here. First, comparable materials selection and thickness that results in no deleterious diffusion. Second, the utilization of a diffusion barrier material (layer 139 in FIG. 1A).

The infrared light energy that is not absorbed by the solar cell is transmitted to the reflective back metal layer, which reflects the light back into the adjoining subcell where it can be absorbed in that subcell, thereby increasing current in that subcell and potentially lowering the operating temperature of the solar cell. Options for implementing a reflective back mirror include (i) direct deposition of mirror material to the cell, (ii) introduction of carriers with reflective material on the interface surface, (iii) utilizing a reflective adhesive, and (iv) utilizing reflective panel materials.

The present disclosure covers different specific mirror materials which may have a surface which is (patterned or not patterned): composed of one or more of the metals Ag, Au, Al, Be, Cu, Mo and Ni, or a combination thereof, deposited to a thickness between 50 nm-5 µm. Between the mirror material and the solar cell there may be deposited an optional additional diffusion barrier material layer. The diffusion barrier material layer can be composed of one or more of the following metals: Cr, Pd, Pt, Ti, or TiN deposited to a thickness of 0.1 nm-10 nm. In some embodiments a diffusion barrier layer thickness of 1.0 to 3.0 nm may be implemented.

In addition to the implementation of a reflective back metal layer, the baseline inverted metamorphic multijunction solar cells illustrated in the present disclosure follows a design rule that one should incorporate as many high bandgap subcells as possible to achieve the goal to increase high temperature EOL performance. For example, high bandgap subcells may retain a greater percentage of cell voltage as temperature increases, thereby offering lower power loss as temperature increases. As a result, both HT-BOL and HT-EOL performance of the exemplary inverted metamorphic multijunction solar cell may be expected to be greater than traditional cells.

For example, the cell efficiency (%) measured at room temperature (RT) 28° C. and high temperature (HT) 70° C., at beginning of life (BOL) and end of life (EOL), for a standard three junction commercial solar cell (ED) is as follows:

| Condition | Efficiency | |
|---|---|---|
| BOL 28° C. | 29.1% | |
| BOL 70° C. | 26.4% | |
| EOL 70° C. | 23.4% | After 5E14 e/cm$^2$ radiation |
| EOL 70° C. | 22.0% | After 1E15 e/cm$^2$ radiation |

For the four junction inverted metamorphic multijunction solar cell depicted in FIGS. 1A and 1B and described in the related application, (the "IMMX") the corresponding data (without implementing the graded hand gap of the present application) is as follows:

| Condition | Efficiency | |
|---|---|---|
| BOL 28° C. | 29.5% | |
| BOL 70° C. | 26.6% | |
| EOL 70° C. | 24.7% | After 5E14 e/cm$^2$ radiation |
| EOL 70° C. | 24.2% | After 1E15 e/cm$^2$ radiation |

One should note the slightly higher cell efficiency of the IMMX solar cell than the standard commercial solar cell (ZTJ) at BOL both at 28' C. and 70° C. However, the IMMX solar cell described above exhibits substantially improved cell efficiency (%) over the standard commercial solar cell (ZTJ) at 1 MeV electron equivalent fluence of $5 \times 10^{14}$ e/cm$^2$, and dramatically improved cell efficiency (%) over the standard commercial solar cell (ZTJ) at 1 MeV electron equivalent fluence of $1 \times 10^{15}$ e/cm$^2$.

For the five junction IMMX solar cell depicted in FIGS. 2A and 2B described in one or more of the related applications, the corresponding data (without implementing the graded band gap of the present application) is as follows:

| Condition | Efficiency | |
|---|---|---|
| BOL 28° C. | 32.1% | |
| BOL 70° C. | 30.4% | |
| EOL 70° C. | 27.1% | After 5E14 e/cm$^2$ radiation |
| EOL 70° C. | 25.8% | After 1E15 e/cm$^2$ radiation |

In some embodiments, the solar cell according to the present disclosure is also applicable to low intensity (LI) and/or low temperature (LT) environments, such as might be experienced in space vehicle missions to Mars, Jupiter, and beyond. A "low intensity" environment refers to a light intensity being less than 0.1 suns, and a "low temperature" environment refers to temperatures being in the range of less than minus 100 degrees Centigrade.

For such applications, depending upon the specific intensity and temperature ranges of interest, the band gaps of the subcells may be adjusted or "tuned" to maximize the solar cell efficiency, or otherwise optimize performance (e.g. at EOL or over the operational working life period).

In view of different satellite and space vehicle requirements in terms of operating environmental temperature, radiation exposure, and operational life, a range of subcell designs using the design principles of the present disclosure may be provided satisfying specific defined customer and mission requirements, and several illustrative embodiments are set fourth hereunder, along with the computation of their efficiency at the end-of-life for comparison purposes. As described in greater detail below, solar cell performance after radiation exposure is experimentally measured using 1 MeV electron fluence per square centimeter (abbreviated in the text that follows as e/cm$^2$), so that a comparison can be made between the current commercial devices and embodiments of solar cells discussed in the present disclosure.

As an example of different mission requirements, a low earth orbit (LEO) satellite will typically experience radiation of protons equivalent to an electron fluence per square centimeter in the range of $1 \times 10^{12}$ e/cm$^2$ to $2 \times 10^{14}$ e/cm$^2$ (hereinafter may be written as "2E10 e/cm$^2$ or 2E14") over a five year lifetime. A geosynchronous earth orbit (GEO) satellite will typically experience radiation in the range of $5 \times 10^{14}$ e/cm$^2$ to $1 \times 10^{15}$ e/cm$^2$ over a fifteen year lifetime.

The wide range of electron and proton energies present in the space environment necessitates a method of describing the effects of various types of radiation in terms of a radiation environment which can be produced under laboratory conditions. The methods for estimating solar cell degradation in space are based on the techniques described by Brown et al. [Brown, W. L., J. D. Gabbe, and W. Rosenzweig, Results of the Telstar Radiation Experiments, Bell System Technical J., 42, 1505, 1963] and Tada [Pada, H. Y., J. R. Carter, Jr., B. E. Anspaugh, and R. G. Downing, Solar Cell Radiation Handbook, Third Edition, JPL Publication 82-69, 1982]. In summary, the omnidirectional space radiation is converted to a damage equivalent unidirectional fluence at a normalized energy and in terms of a specific radiation particle. This equivalent fluence will produce the same damage as that produced by omnidirectional space radiation considered when the relative damage coefficient (RDC) is properly defined to allow the conversion. The relative damage coefficients (RDCs) of a particular solar cell structure are measured a priori under many energies and fluence levels in addition to different cover glass thickness values. When the equivalent fluence is determined for a given space environment, the parameter degradation can be evaluated in the laboratory by irradiating the solar cell with the calculated fluence level of unidirectional normally incident flux. The equivalent fluence is normally expressed in terms of 1 MeV electrons or 10 MeV protons.

The software package Spenvis (www.spenvis.oma.be) is used to calculate the specific electron and proton fluence that a solar cell is exposed to during a specific satellite mission as defined by the duration, altitude, azimuth, etc. Spenvis employs the EQFLUX program, developed by the Jet Propulsion Laboratory OPP to calculate 1 MeV and 10 MeV damage equivalent electron and proton fluences, respectively, for exposure to the fluences predicted by the trapped radiation and solar proton models for a specified mission environment duration. The conversion to damage equivalent fluences is based on the relative damage coefficients determined for multijunction cells [Marvin, D. C., Assessment of Multifunction Solar Cell Performance in Radiation Environments, Aerospace Report No. TOR-2000 (1210)-1, 2000]. New cell structures eventually need new RDC measurements as different materials can be more or less damage resistant than materials used in conventional solar cells. A widely accepted total mission equivalent fluence for a geosynchronous satellite mission of 15 year duration is 1 MeV $1 \times 10^{15}$ electrons/cm$^2$.

The exemplary solar cell described herein may require the use of aluminum in the semiconductor composition of each of the top two or three subcells. Aluminum incorporation is widely known in the III-V compound semiconductor industry to degrade BOL subcell performance due to deep level donor defects, higher doping compensation, shorter minority carrier lifetimes, and lower cell voltage and an increased BOL $E_g$-$V_{oc}$ metric. In short, increased BOL $E_g$-$V_{oc}$ may be the most problematic shortcoming of aluminum containing subcells; the other limitations can be mitigated by modifying the doping schedule or thinning base thicknesses.

Furthermore, at BOL, it is widely accepted that great subcells have a room temperature $E_g$-$V_{oc}$ of approximately 0.4. A wide variation in BOL $E_g$-$V_{oc}$ may exist for subcells of interest to IMMX cells. However, Applicants have found that inspecting $E_g$-$V_{oc}$ at HT-EOL may reveal that aluminum containing subcells perform no worse than other materials used in III-V solar cells. For example, all of the subcells at EOL, regardless of aluminum concentration or degree of lattice-mismatch, have been shown to display a nearly-fixed $E_g$-$V_{oc}$ of approximately 0.6 at room temperature 28° C.

The exemplary inverted metamorphic multijunction solar cell design philosophy may be described as opposing conventional cell efficiency improvement paths that employ infrared subcells that increase in expense as the bandgap of the materials decreases. For example, proper current matching among all subcells that span the entire solar spectrum is often a normal design goal. Further, known approaches—including dilute nitrides grown by MBE, upright metamorphic, and inverted metamorphic multijunction solar cell designs—may add significant cost to the cell and only marginally improve HT-EOL performance. Still further, lower HT-EOL $/W may be achieved when inexpensive high bandgap subcells are incorporated into the cell architecture, rather than more expensive infrared subcells. The key to enabling the exemplary solar cell design philosophy described herein is the observation that aluminum containing subcells perform well at HT-EOL.

It will be understood that each of the elements described above, or two or more together, also may find a useful application in other types of structures or constructions differing from the types of structures or constructions described above.

The terminology used in this disclosure is for the purpose of describing specific identified embodiments only and is not intended to be limiting of different examples or embodiments.

In the drawings, the position, relative distance, lengths, widths, and thicknesses of supports, substrates, layers, regions, films, etc., may be exaggerated for presentation simplicity or clarity. Like reference numerals designate like elements throughout the specification. It will be understood that when an element such as an element layer, film, region, or feature is referred to as being "on" another element, it can be disposed directly on the other element or the presence of intervening elements may also be possible. In contrast, when an element is referred to as being disposed "directly on" another element, there are no intervening elements present.

Furthermore, those skilled in the art will recognize that boundaries and spacings between the above described units/operations are merely illustrative. The multiple units/operations may be combined into a single unit/operation, a single unit/operation may be distributed in additional units/operations, and units/operations may be operated at least partially overlapping in time. Moreover, alternative embodiments may include multiple instances of a particular unit/operation, and the order of operations may be altered in various other embodiments.

The terms "substantially", "essentially", "approximately", "about", or any other similar expression relating to particular parametric numerical value are defined as being close to that value as understood by one of ordinary skill in the art in the context of that parameter, and in one non-limiting embodiment the term is defined to be within 10% of that value, in another embodiment within 5% of that value, in another embodiment within 1% of that value, and in another embodiment within 0.5% of that value.

The term "coupled" as used herein is defined as connected, although not necessarily directly or physically adjoining, and not necessarily structurally or mechanically. A device or structure that is "configured" in a certain way is arranged or configured in at least that described way, but may also be arranged or configured in ways that are not described or depicted.

The terms "front", "back", "side", "top", "bottom", "over", "on" "above", "beneath", "below", "under", and the like in the description and the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein. For example, if the assembly in the figures is inverted or turned over, elements of the assembly described as "below" or "beneath" other elements or features would then be oriented "above" the other elements or features. Thus, the exemplary term "below" can encompass both an orientation of above and below. The assembly may be otherwise oriented (rotated by a number of degrees through an axis).

The terms "front side" and "backside" refer to the final arrangement of the panel, integrated cell structure or of the individual solar cells with respect to the illumination or incoming light incidence.

In the claims, the word 'comprising' or 'having' does not exclude the presence of other elements or steps than those listed in a claim. it is understood that the terms "comprises", "comprising", "includes", and "including" if used herein, specify the presence of stated components, elements, features, steps, or operations, components, but do not preclude the presence or addition of one or more other components, elements, features, steps, or operations, or combinations and permutations thereof.

The terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the claim includes the introductory phrases "one or more" or "at least one" and indefinite articles such as "a" or "an". The same holds true for the use of definite articles.

The present disclosure can be embodied in various ways. To the extent a sequence of steps are described, the above described orders of the steps for the methods are only intended to be illustrative, and the steps of the methods of the present disclosure are not limited to the above specifically described orders unless otherwise specifically stated. Note that the embodiments of the present disclosure can be freely combined with each other without departing from the spirit and scope of the disclosure.

Although some specific embodiments of the present disclosure have been demonstrated in detail with examples, it should be understood by a person skilled in the art that the above examples are only intended to be illustrative but not to limit the scope and spirit of the present disclosure. The above embodiments can be modified without departing from the scope and spirit of the present disclosure which are to be defined by the attached claims. Accordingly, other implementations are within the scope of the claims.

Although described embodiments of the present disclosure utilizes a vertical stack of a certain illustrated number of subcells, various aspects and features of the present disclosure can apply to stacks with fewer or greater number of subcells, i.e. two junction cells, three junction cells, four, five, six, seven junction cells, etc.

In addition, although the disclosed embodiments are configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the solar cell described) in the present disclosure may utilize an arrangement of one or more, or all, homojunction cells or subcells, i.e., a cell or subcell in which the p-n junction is formed between a p-type semiconductor and an n-type semiconductor both of Which have the same chemical composition and the same band gap, differing only in the dopant species and types, and one or more heterojunction cells or subcells, Subcell C, with p-type and n-type InGaAs is one example of a homojunction subcell.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or emitter layer may also be intrinsic or not-intentionally-doped ("ND") over part or all of its thickness.

The composition of the window or BSF layers may utilize other semiconductor compounds, subject to lattice constant and band gap requirements, and may include AlInP, AlAs, AlP, AlGaInP, AlGaAsP, AlGaInAs, AlGaInAs, AlGaInPAs, GaInP, GaInAs, GaInPAs, AlGaAs, AlInAs, AlInPAs, GaAsSb, GaAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

Thus, while the description of the semiconductor device described in the present disclosure has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand, LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, from the forgoing others can, by applying current knowledge, readily adapt the present invention for various applications. Such adaptions should and are intended to be comprehended within the meaning and range of equivalence of the following claims.

The invention claimed is:
1. A solar cell comprising:
an epitaxial sequence of layers of semiconductor material forming at least a top or light facing solar subcell and a second solar subcell having a top surface and a bottom surface and being disposed below the top or light facing solar subcell;
a semiconductor contact layer having a top surface and a bottom surface, the top surface of the semiconductor contact layer being disposed below the bottom surface of the second solar subcell;
a diffusion barrier layer below the bottom surface of the semiconductor contact layer, wherein the diffusion barrier layer has a thickness of between 0.1 nm and 10 nm, and wherein the diffusion barrier layer is composed of Pd or a Pd alloy;
a reflective metal layer having a thickness between 50 nm and 5 microns and being disposed below a bottom surface of the diffusion barrier layer, wherein reflectivity of the reflective metal layer is greater than 80% in the wavelength range 850-2000 nm for reflecting light back toward the second solar subcell; and a contact metal layer composed of one or more layers of Ag, Au, and Ti disposed on a bottom of said reflective metal layer.

2. A solar cell as defined in claim 1, wherein the reflective metal layer comprises one or more of the following metals or alloys thereof: Ag, Al, Au, Be, Cu, Ni or Ti.

3. A solar cell method as defined in claim 2, wherein the reflective metal layer is deposited directly on a bottom surface of the diffusion barrier layer.

4. A solar cell as defined in claim 3, wherein the diffusion barrier layer is composed of one or more layers of Cr, Pd, Pt, Si, Ti or TiN.

5. A solar cell as defined in claim 1, wherein the sequence of layers of semiconductor material further include a third solar subcell below the second solar subcell; a first grading interlayer below the third solar subcell; and a second sequence of layers of semiconductor material below the first grading interlayer and forming a fourth solar subcell, the fourth solar subcell being lattice mismatched to the third solar subcell, wherein the semiconductor contact layer is disposed below a surface of the fourth solar subcell.

6. A solar cell as defined in claim 5, wherein the first graded interlayer is compositionally graded to lattice matched the third solar subcell on one side and the lower fourth solar subcell on the other side, and is composed of one or more of As, P, N, Sb based III-V compound semiconductors subject to the constraints of having the in-plane lattice parameter greater than or equal to that of the third solar subcell and less than or equal to that of the fourth solar subcell, and having a band gap energy greater than that of the third solar subcell and the fourth solar subcell.

7. A solar cell as defined in claim 5, wherein, the fourth solar subcell has a band gap in the range of approximately 1.05 to 1.15 eV, the third solar subcell has a band gap in the range of approximately 1.40 to 1.50 eV, the second solar subcell has a band gap in the range of approximately 1.65 to 1.78 eV and the top or light facing solar subcell has a hand gap in the range of 1.42 to 2.2 eV, and wherein the graded interlayer is composed of $(In_xGa_{1-x})Al_{1-y}As$ with $0<x<1$, $0<y<1$, and x and y selected such that the band gap remains constant throughout its thickness, and the band gap of the graded interlayer remains at a constant value in the range of 1.42 to 1.60 eV throughout its thickness.

8. A solar cell as defined in claim 5, wherein the top or light facing solar subcell is composed of AlGaInP, the second solar subcell is composed of an InGaP emitter layer and an AlGaAs base layer, the third solar subcell is composed of GaAs, and the fourth solar subcell is comprised of InGaAs.

9. A solar subcell as defined in claim 5, further comprising:
a distributed Bragg reflector (DBR) layer adjacent to and between the second and the third solar subcells and arranged so that light can enter and pass through the second solar subcell and at least a portion of which can be reflected back into the second subcell by the DBR layer.

10. A solar cell as defined in claim 5, further comprising:
a distributed Bragg reflector (DBR) layer adjacent to and between the third solar subcell and the graded interlayer and arranged so that light can enter and pass through the third solar subcell and at least a portion of which can be reflected back into the third solar subcell by the DBR layer.

11. A solar cell as defined in claim 10, wherein the DBR layer is composed of a plurality of alternating layers of lattice matched materials with discontinuities in their respective indices of refraction.

12. A solar cell as defined in claim 11, wherein the difference in refractive indices between alternating layers is maximized in order to minimize the number of periods required to achieve a given reflectivity, and the thickness and refractive index of each period determines the stop band and its limiting wavelength.

13. A solar cell as defined in claim 11, wherein the DBR layer includes a first DBR layer composed of a plurality of p type $Al_xGa_{1-x}As$ layers, and a second DBR layer disposed over the first DBR layer and composed of a plurality of p type $Al_yGa_{1-y}As$ layers, with $0<x<1$, $0<y<1$, and where y is greater than x.

14. A solar cell as defined in claim 9, wherein the DBR layer is composed of a plurality of alternating layers of lattice matched materials with discontinuities in their respective indices of refraction.

15. A solar cell as defined in claim 14, wherein the difference in refractive indices between alternating layers in maximized in order to minimize the number of periods required to achieve a given reflectivity, and the thickness and refractive index of each period determines the stop band and its limiting wavelength.

16. A solar cell as defined in claim 14, wherein the DBR layer includes a first DBR layer composed of a plurality of p type $Al_xGa_{1-x}As$ layers, and a second DBR, layer disposed over the first DBR layer and composed of a plurality of p type $Al_yGa_{1-y}As$ layers, with $0<x<1$, $0<y<1$, and where y is greater than x.

17. A solar cell as defined in claim 4, wherein the thickness of the diffusion barrier layer is between 1.0 and 3.0 nm.

18. A solar cell as defined in claim 5, wherein each of the second solar subcell and the top or light facing solar subcell comprises aluminum in such quantity that the average band gap of the four solar subcells of the solar cell is greater than 1.44 eV.

19. A solar cell comprising:
a top or light-facing solar subcell;
a second solar subcell below the top of light facing solar subcell;
a third solar subcell below the second solar subcell;
a first grading interlayer deposited below the third solar subcell; and
a fourth solar subcell below the first grading interlayer, the fourth solar subcell being lattice mismatched to the third solar subcell;
a semiconductor contact layer disposed below the fourth solar subcell;
a diffusion barrier layer directly below the semiconductor contact layer, wherein the diffusion barrier layer has a thickness of between 0.1 nm and 10 nm, and wherein the diffusion barrier layer is composed of Pd or a Pd alloy;
a reflective metal layer having a thickness between 50 nm and 5 microns and disposed directly below the fourth solar subcell wherein the reflectivity of the reflective metal layer is greater than 80% in the wavelength range 850-2000 nm for the reflecting light back toward the fourth solar subcell;
wherein the fourth solar subcell has a band gap in the range of approximately 1.05 to 1.15 eV, the third solar subcell has a band gap in the range of approximately 1.40 to 1.50 eV, the second solar subcell has a band gap in the range of approximately 1.65 to 1.78 eV and the top or light facing solar subcell has a band gap in the range of 1.92 to 2.2 eV, and wherein the first graded interlayer is composed of $(In_xGa_{1-x})Al_{1-y}As$ with $0<x<1$, $0<y<1$, and x and y selected such that the band gap of the first graded interlayer remains at a constant value in range of 1.42 to 1.60 eV throughout its thickness.

20. The solar cell of claim 1 wherein the diffusion barrier layer has a thickness in a range of 0.1 nm-5 nm.

* * * * *